US008289086B2

(12) United States Patent
Chen et al.

(10) Patent No.: US 8,289,086 B2
(45) Date of Patent: Oct. 16, 2012

(54) FRACTIONAL AND INTEGER PLL ARCHITECTURES

(75) Inventors: Shuo-Wei Chen, Santa Clara, CA (US); David Kuochieh Su, Cupertino, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 362 days.

(21) Appl. No.: 12/415,878

(22) Filed: Mar. 31, 2009

(65) Prior Publication Data

US 2009/0251225 A1    Oct. 8, 2009

Related U.S. Application Data

(60) Provisional application No. 61/041,879, filed on Apr. 2, 2008.

(51) Int. Cl.
*H03L 7/085* (2006.01)
*H03L 7/089* (2006.01)
*H03L 7/099* (2006.01)

(52) U.S. Cl. .............. 331/1 A; 331/25; 331/57; 375/376

(58) Field of Classification Search .................. 331/1 A, 331/25, 57; 375/376
See application file for complete search history.

(56) References Cited

U.S. PATENT DOCUMENTS

| 6,016,080 A * | 1/2000 | Zuta et al. ............... 331/25 |
| 6,028,488 A | 2/2000 | Landman et al. |
| 6,114,914 A * | 9/2000 | Mar ......................... 331/16 |
| 6,526,109 B1 | 2/2003 | Chang et al. |
| 6,823,033 B2 * | 11/2004 | Fahim ...................... 375/376 |
| 6,950,957 B1 | 9/2005 | O'Leary |
| 7,315,596 B2 * | 1/2008 | Payne et al. ............. 375/355 |
| 7,577,225 B2 | 8/2009 | Azadet et al. |
| 7,777,580 B2 * | 8/2010 | Dosho et al. ............. 331/57 |
| 2003/0151465 A1 | 8/2003 | Wood |
| 2004/0239922 A1 | 12/2004 | Modlin et al. |
| 2005/0286506 A1 | 12/2005 | LaBerge |
| 2006/0022737 A1 | 2/2006 | Gregorius et al. |

(Continued)

OTHER PUBLICATIONS

Author: Youngdon Choi, Deog-Kyoon Jeong and Wonchan Kim Title: Jitter Transfer Analysis of Tracked Oversampling Techniques for Multigigabit Clock and Data Recovery Date: Nov. 2006; Publisher: IEEE Transactions on Circuits and System-II: Analog and Digital signal Processing vol. 50, No. 11, Nov. 2003.*

(Continued)

*Primary Examiner* — Arnold Kinkead
*Assistant Examiner* — Richard Tan
(74) *Attorney, Agent, or Firm* — Bever, Hoffman & Harms, LLP

(57) ABSTRACT

A digital fractional PLL introduces an accumulated phase offset before the digital VCO using a digital accumulator to achieve the fractional part of the division ratio. To provide this phase offset, the digital accumulator can integrate a fractional component $\Delta n$. By forcing $\Delta n$ to zero, the PLL becomes an integer-N PLL. A de-skew timing configuration can be used to remove any time mismatch between integer and fractional counters of the PLL. A digital PLL can merge the function of frequency generation (DVCO) and that of fractional frequency counting into the same circuit block by reusing various phases of the frequency output to generate a fractional frequency count. A digital integer PLL can include a single bit comparator, wherein the feedback loop of this PLL forces the phase difference between the reference clock signal and the feedback signal to approach zero. By changing the duty cycle of feedback signal, the frequency tracking behavior of the loop can be varied.

14 Claims, 11 Drawing Sheets

U.S. PATENT DOCUMENTS

| | | | |
|---|---|---|---|
| 2006/0066368 A1 | 3/2006 | Gabato et al. | |
| 2006/0164132 A1 | 7/2006 | Martin et al. | |
| 2006/0192623 A1* | 8/2006 | Baig et al. | 331/57 |
| 2007/0001772 A1* | 1/2007 | Da Dalt | 331/78 |
| 2007/0096836 A1 | 5/2007 | Lee et al. | |
| 2008/0048791 A1* | 2/2008 | Fahim | 331/1 A |
| 2008/0054944 A1* | 3/2008 | Kwon | 326/83 |
| 2008/0061895 A1 | 3/2008 | Kelkar et al. | |
| 2008/0075152 A1 | 3/2008 | Melanson | |
| 2010/0277244 A1* | 11/2010 | Chang et al. | 331/16 |

OTHER PUBLICATIONS

Author: Volodymyr Kratyuk, Pavan Kumar Hanumolu, Un-Ku Moon, Kartikeya Mayaram Title: A Design Procedure for All-Digital Phase-Locked Loops Based on a Charge-Pump Phase-Locked-Loop Analogy Date: Mar. 2007; Publisher IEEE Transactions on Circuits and Systems vol. 54, No. 3, Mar. 2007.*

Staszewski et al.: "All Digital Phase-Domain TX Frequency Synthesizer for Bluetooth Radios in 0.13 μm CMOS", 2004 IEEE International Solid-State Circuits Conference, ISSCC, Session 15, Wireless Consumer ICs / 15.3, 10 pgs.

Kajiwara et al.: "A New PLL Frequency Synthesizer With High Switching Speed", IEEE Transactions on Vehicular Techology, vol. 41, No. 4, Nov. 1992, pp. 407-413.

International Search Report and Written Opinion—PCT/US2009/039204, ISA/US, May 26, 2009.

* cited by examiner

FRACTIONAL AND INTEGER PLL ARCHITECTURES

RELATED APPLICATIONS

This application claims priority of U.S. Provisional Patent Application 61/041,879, entitled "Mostly Digital PLL Architecture For Integer-N And Fractional-N Mode Operation" filed Apr. 2, 2008.

BACKGROUND OF THE INVENTION

The present invention relates to phase locked loops (PLLs) and in particular to improved fractional and integer PLL architectures.

RELATED ART

FIG. 1 illustrates a conventional fractional PLL 100 that can vary its PLL output, which is generated by a voltage controlled oscillator (VCO) 104. In PLL 100, an integer divider 105 receives an output of VCO 104 as well as an output of a sigma delta modulator (SDM) 106. SDM 106 receives a fractional part ($\Delta n$) of a desired feedback ratio so that the mean value of the output of SDM 106 equals $\Delta n$. This output of SDM 106 dithers a feedback signal FB generated by integer divider 105.

A phase/frequency detector (PFD) 101 determines a phase difference between the feedback signal FB and a reference clock signal REF. A charge pump 102 converts this phase difference into positive or negative charge pulses depending on whether the reference clock phase leads or lags the divider signal phase and provides these charge pulses to a loop filter 103. Loop filter 103 integrates these charge pulses/time indices to generate a control voltage, which is provided to VCO 104. In this configuration, the frequency of the VCO output is locked to a frequency of the reference clock signal REFCLK multiplied by a frequency division ratio.

In one embodiment of a digital fractional PLL, charge pump 102 can be replaced by a time-to-digital converter (TDC), which converts any phase differences into a digital representation of their time indices. That is, the TDC does not measure magnitude, but instead indicates an arrival time of each phase difference. A digital version of loop filter 103 then takes the phase information and generates a digital control code for a digitally controlled VCO.

Unfortunately, this configuration introduces the quantization noise of a VCO period because it changes the feedback divider ratio by an integer amount. For example, if a feedback signal of 2.6 is desired, then fractional PLL 100 is configured to dither between 2.0 and 3.0 in a predetermined ratio by a SDM to obtain the 2.6. This SDM-introduced noise is traditionally filtered by loop filter 103, wherein the amount of degradation to the PLL phase noise depends on the settings of loop filter 103. This SDM-introduced noise not only increases the in-band noise floor but also generates fractional spurs due to the non-linearity of the rest of PLL loop.

Therefore, a need arises for improved fractional and integer PLL architectures.

SUMMARY OF THE INVENTION

An improved digital fractional phase-locked loop (PLL) can include a digital voltage controlled oscillator (DVCO), an integer divider, a phase/frequency detector, a time-to-digital converter (TDC), a digital accumulator block, and digital loop filter. The integer divider can receive an output of the DVCO and generate a feedback signal. The phase/frequency detector can determine phase differences between the feedback signal and a reference clock signal. The TDC can convert these phase differences into digital representations of their time indices. The digital accumulator block can introduce an accumulated phase offset to these digital representations using a fractional component of a division ratio. The digital loop filter can filter the difference of the digital accumulator and provide a resulting digital code word to the DVCO.

A further improvement of the digital fractional PLL includes a Digital-in Digital-out VCO (DDVCO). This DDVCO can be characterized as merging the digital voltage controlled oscillator (DVCO) and the TDC into a single digital timing block, thereby saving circuit area and power as well as avoiding any calibration and additional spurs due to inaccurate TDC gain. The DDVCO receives a digital input code that controls its oscillation frequency and generates a digital (binary) word that represents its frequency and phase. This digital word is called the feedback signal in the DDVCO embodiment.

In one embodiment, the DDVCO can include an integer counter block for generating an integer output as well as a fractional counter block for generating a fraction output. The least significant bit (LSB) of the integer output of the digital word is a square wave at the DVCO oscillation frequency. Note that the timing between the integer output and the fraction output can be imbalanced. Therefore, the DDVCO can further include a timing de-skew block that can ensure the proper function of a TDC without a need to turn on/off the fractional counter block.

In one embodiment, the timing de-skew block can read the integer counter outputs on both the first rising and falling edge of the PLL output after the reference clock goes high. Meanwhile, the PLL output is re-timed by the reference clock and used to select an integer counter reading as the integer output.

The fractional counter block can include a plurality of inverters (delay cells) forming a delay chain, a set of flip-flops for storing respective outputs of the delay cells, and an interpolator. The plurality of delay cells can also function as a ring oscillator based DVCO whose oscillation frequency is controlled by programming current, voltage, or charge through a digital control code. The interpolator can include a plurality of interpolator cells. In turn, each interpolator cell can include two pre-amplifiers, which receive two clock waveforms with different phases (i.e. two differential signals). The amplified differential voltages can be converted into differential currents. These differential currents can be summed and then captured by a regenerative latch. In this configuration, the interpolator cell effectively latches a virtually interpolated clock waveform. Ideally, if the two pre-amplifiers are identical, then the interpolation unit can latch a clock whose phase is interpolated exactly at the mid point of the two clock waveforms. Note that, by skewing the pre-amplifiers, one can move the interpolated phase closer to one of the two clock waveforms. Outputs of the plurality of flip-flops and the interpolator cells provide the fractional component.

In one embodiment, each VCO cell in a differential configuration can include a first inverter and a second inverter configured such that an output of the first inverter is weakly connected to an input of the second inverter, and an output of the second inverter is weakly connected to an input of the first inverter through resistors.

A 1-bit digital integer PLL is also described. This digital integer PLL can include a 1-bit comparator, a digital loop filter, a digital voltage controlled oscillator, and an integer divider. The 1-bit comparator can determine phase differences between a feedback signal and a reference clock signal. The digital loop filter can integrate outputs of the 1-bit comparator and generate a control voltage. The digital voltage controlled oscillator (DVCO) can receive the control voltage and generate an output of the digital integer PLL. The integer divider can receive the output of the digital integer PLL and generate the feedback signal. In one embodiment, the 1-bit comparator can function as a linear detector in a vicinity of zero crossing. Notably, in this configuration, by changing a duty cycle of the feedback signal, a frequency tracking behavior of the digital integer PLL can be advantageously varied.

An analog fractional phase-locked loop (PLL) can include a voltage controlled oscillator (VCO), an integer divider, a phase/frequency detector (PFD), an analog accumulator block, and a loop filter. The integer divider can receive an output of the VCO and generate a feedback signal. The PFD can determine phase differences between the feedback signal and a reference clock signal. The analog accumulator block can introduce an accumulated phase offset to an output of the PFD using a fractional component of a division ratio. The loop filter can integrate outputs of the analog accumulator block and provide a resulting voltage to the VCO.

DETAILED DESCRIPTION OF THE FIGURES

Figure 2:
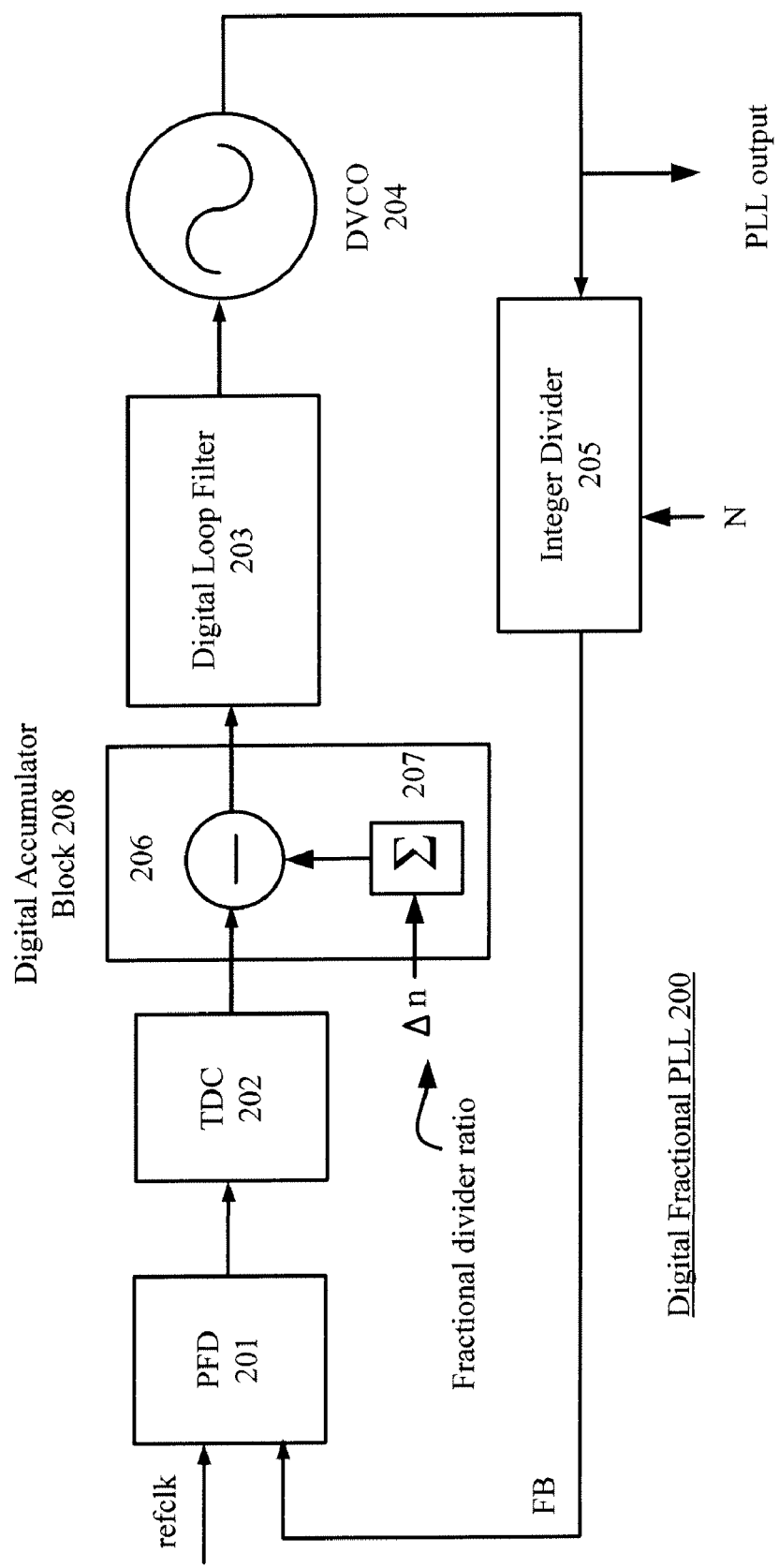
FIG. 2 illustrates an improved fractional-N PLL with a digital accumulator.

FIG. 2 illustrates an improved fractional PLL 200. In this digital embodiment, PLL 200 uses a digital VCO (DVCO) 204 and a digital loop filter 203 to replace their analog counterparts. An integer divider 205 receives an output of DVCO 204 (i.e. the PLL output) and generates a feedback signal FB. In one embodiment, integer divider 205 can be implemented using a 9-bit, synchronous, cascaded counter that can run up at 950 MHz (e.g. a ratio of the VCO frequency, wherein the PLL output can drive the clock provided to the counter of integer divider 205).

A phase/frequency detector (PFD) 201 determines phase differences between the feedback signal FB and a reference clock signal (refclk). These phase differences are provided to a time-to-digital converter (TDC) 202, which converts all such phase differences into digital representations of their time indices. That is, TDC 202 does not measure magnitude, but instead indicates an arrival time of each phase difference.

To support fractional-N operation, PLL 200 introduces an accumulated phase offset to the output of TDC 202 using a subtractor 206 and a digital accumulator 207 (wherein subtractor 206 and digital accumulator 207 can be characterized as a digital accumulator block 208). Specifically, digital accumulator 207 can be used to integrate the signals Δn (provided by software, firmware, or a register), which represents a fractional part of the division ratio, and provide that integrated value as an input to subtractor 206. Subtractor 206 subtracts that integrated value from the output of TDC 202. A digital loop filter 203 filters the outputs of digital accumulator block 208 to generate a digital control word, which is provided to DVCO 204. This digital control word will adjust either a current, voltage, or charge of the DVCO to adjust its oscillation frequency.

Figure 1:
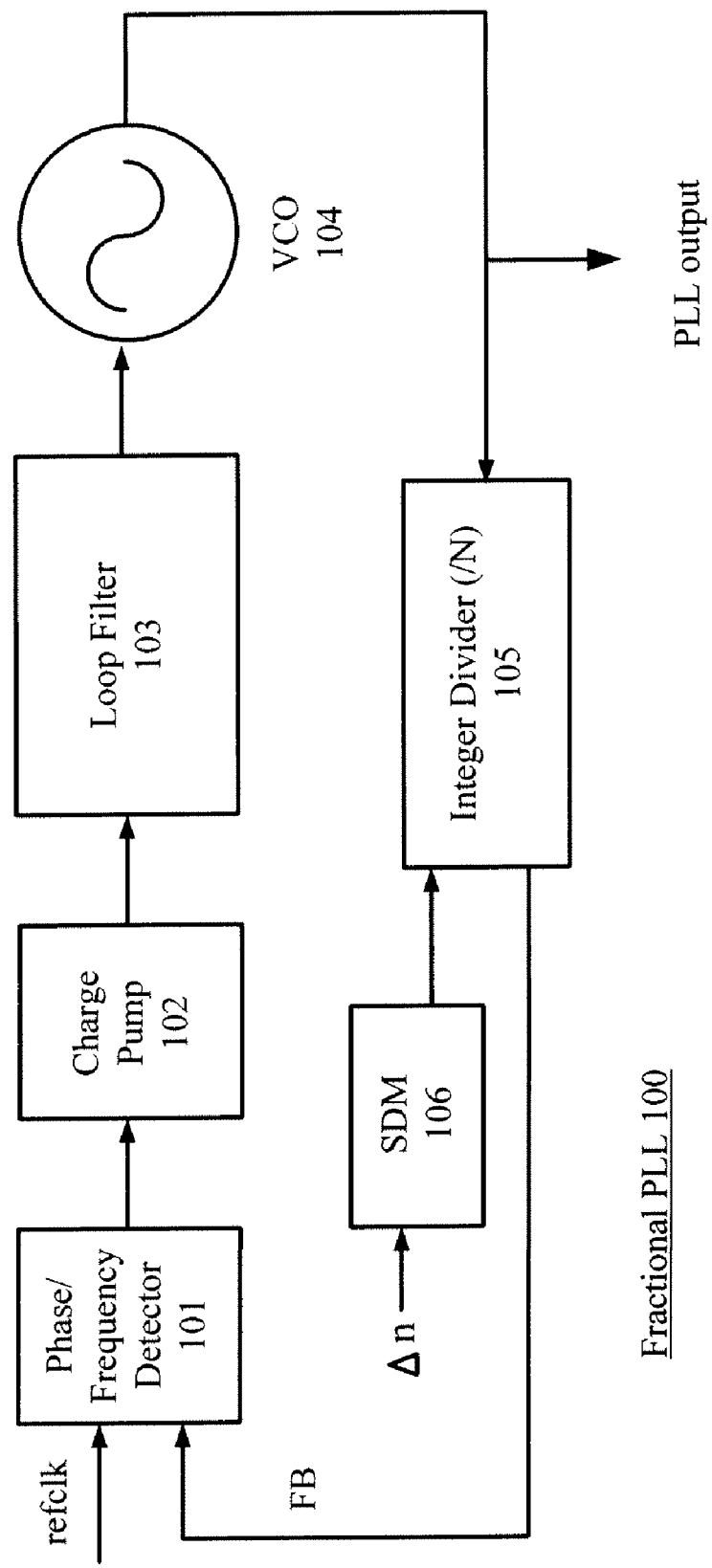
FIG. 1 illustrates a conventional fractional-N PLL.

Advantageously, by eliminating the SDM of FIG. 1 and replacing it with a digital accumulator block 208, PLL 200 does not generate any explicit sigma-delta quantization noise and also simplifies circuit complexity. Moreover, in this configuration, the precision of the effective feedback division ratio only depends on the finite word length of Δn and digital accumulator 207.

As discussed above, TDC 202 basically quantizes the phase differences as determined by PFD 201 and generates a corresponding digitized output word. In one embodiment, the output bit-width of TDC 202 may be 19 bits, although system requirements may reduce or increase that number of bits (e.g. between 15-20 bits). The output bit-width can be computed by dividing the phase difference ($\phi_{input}$) by the quantization resolution, i.e. $\phi_{input}$/quantization resolution. In one embodiment, the quantization resolution can be 1/20 of a VCO period. For example, if PFD 201 determines a phase difference ($\phi_{input}$) of 1 ns and a quantization step of TDC 202 is 0.2 ns, then the output bit-width is 5 (i.e. 1/0.2=5).

Note that Δn may have a bit-width of between 9-16 (e.g. 10 bits) and should be between 0 and 1. In one embodiment, the output of subtractor 206 may be thirteen bits wide, although the actual outputs of TDC 202 and digital accumulator 208 may reduce or increase that number accordingly. In another embodiment, the output of digital loop filter 203 (and thus the input to DVCO 204) may be 8 bits, with internal processing being 16 bits wide.

Figure 3:
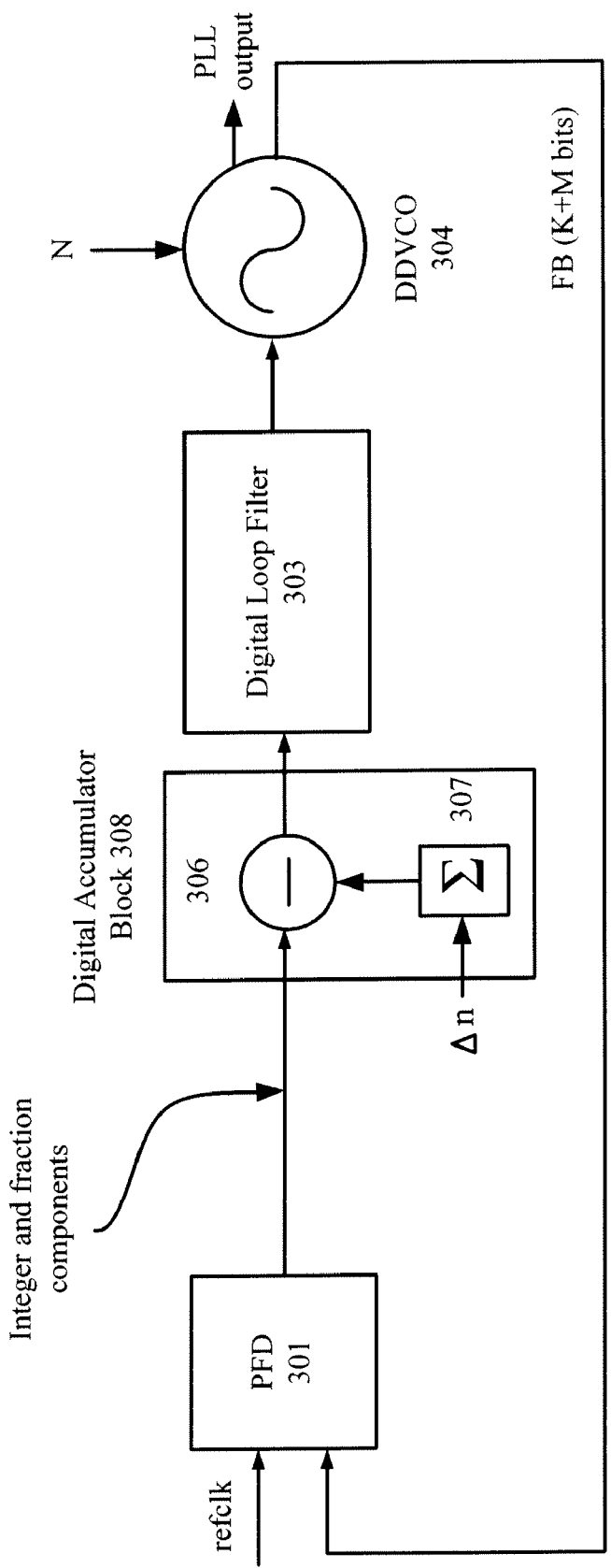
FIG. 3 illustrates a further improved fractional-N PLL including a DDVCO.

FIG. 3 illustrates a further improved digital fractional PLL 300. In this digital embodiment, PLL 300 includes a digital-in digital-out VCO (DDVCO) 304 that generates a digital output word acting as the feedback signal FB. This output word consists of a K-bit integer output and an M-bit fraction output. In one embodiment described further in reference to FIG. 4A, the K-bit integer output is generated by an integer counter block, whereas the M-bit fraction output is generated by a fractional counter block.

A phase/frequency detector (PFD) 301 determines phase differences between the feedback signal FB (i.e. the K-bit integer output and the M-bit fraction output) and a reference clock signal refclk. These phase differences are converted into digital representations of their time indices, which are called integer and fractional components in FIG. 3.

Fractional-N operation can be supported by PLL 300 in the same way as PLL 200 with a digital accumulator block 308 in the forward path of the PLL to accumulate phase offset using a subtractor 306 and a digital accumulator 307. A digital loop filter 303 filters the outputs of digital accumulator block 308 and generates a digital control word, which is provided to DDVCO 304 to control its oscillation frequency.

DDVCO 304 generates a K+M bit digital output word (i.e. the feedback signal FB) that can be quantized by PDF 301 to determine the phase differences between the feedback signal and the reference clock refclk. In one embodiment, the output bit-width of DDVCO 304 may be 9 bits, although system requirements may reduce or increase that number of bits (e.g. between 5-10 bits). In one embodiment, the quantization resolution of the M-bit fraction output can be 1/20 of a VCO period. In another embodiment, the output of digital loop filter 303 (and thus the input to DDVCO 304) may be 8 bits, with internal processing being 16 bits wide.

Although FIG. 3 illustrates DDVCO 304 as being a single component, other embodiments may show these components as separate components. Advantageously, because of their relationship discussed above, i.e. that the quantization resolution of DDVCO 304 is expressed as a predetermined fraction of the VCO period, this tracking can be easily implemented in an integrated component while saving area and power and avoiding any additional calibration and spurs.

Figure 4A:
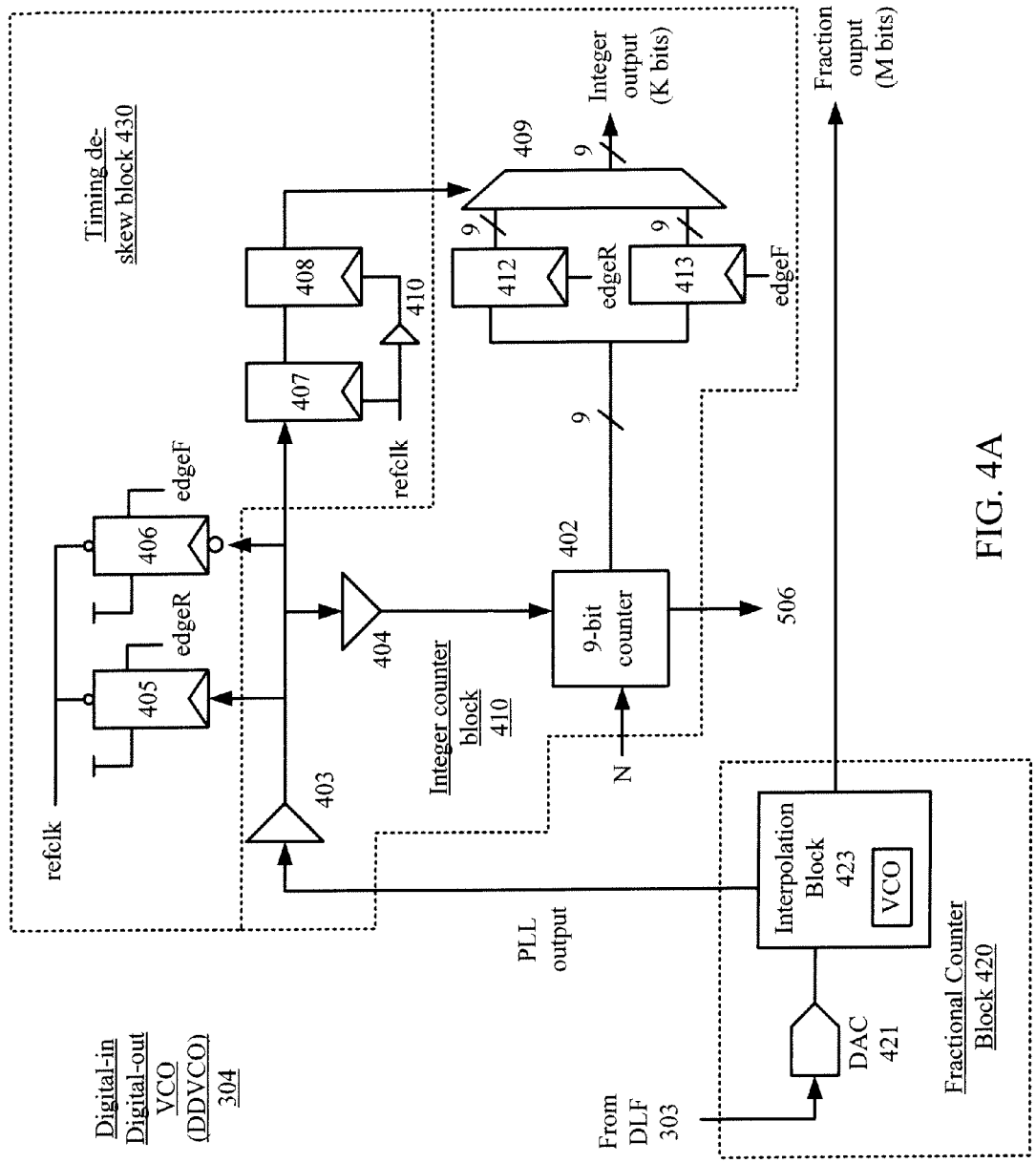
FIG. 4A illustrates an exemplary DDVCO including a fractional counter block, an integer counter block, and a timing deskew block.

Note that there may be timing skew between the K-bit integer output and the M-bit fraction output of the DDVCO 304. In one embodiment shown in FIG. 4A, an exemplary DDVCO 304 includes a fractional counter block 420 and an integer counter block 410 as well as a timing deskew block 430 that can be configured to eliminate the timing skew between the integer output and the fraction output. As shown in FIG. 4A and described above, one output of DDVCO 304 includes a digital word, the digital word comprising a K-bit integer output and an M-bit fraction output that are correctly time aligned. Notably, the least significant bit (LSB) of the integer output of the digital word is a square wave at the DVCO oscillation frequency. As shown in FIG. 4A, another output of DDVCO 304 is a one-bit input to integer counter block 410 at the DVCO oscillation frequency. This one-bit signal is also the PLL output, as labeled.

In one embodiment, integer counter block 410 includes buffers 403, 404, and 410, a counter 402, flip-flops 407, 408, 412, and 413, and a multiplexer 409. Counter 402 (e.g. a 9-bit, synchronous, cascaded counter running up to 950 MHz) receives a digital input N that represents the integer divider ratio similar to that of the integer divider in FIG. 1 (wherein digital input N can also be provided by software or firmware). Counter 402 provides its contents to flip-flops 412 and 413, which are clocked by edgeR and edgeF (both signals explained below), respectively. Multiplexer 409, which is controlled by the output of flip-flop 408, selects between the output of flip-flop 412 and 413 to generate the K-bit integer output.

Fractional counter block 420 can be characterized as the DVCO of the PLL. That is, and explained in reference to FIG. 4B, fractional counter block 420 can include a plurality of inverter elements that generate the oscillation frequency of the VCO. Fractional counter block 420 can also generate the M-bit fraction output with the aid of interpolators.

Figure 4B:
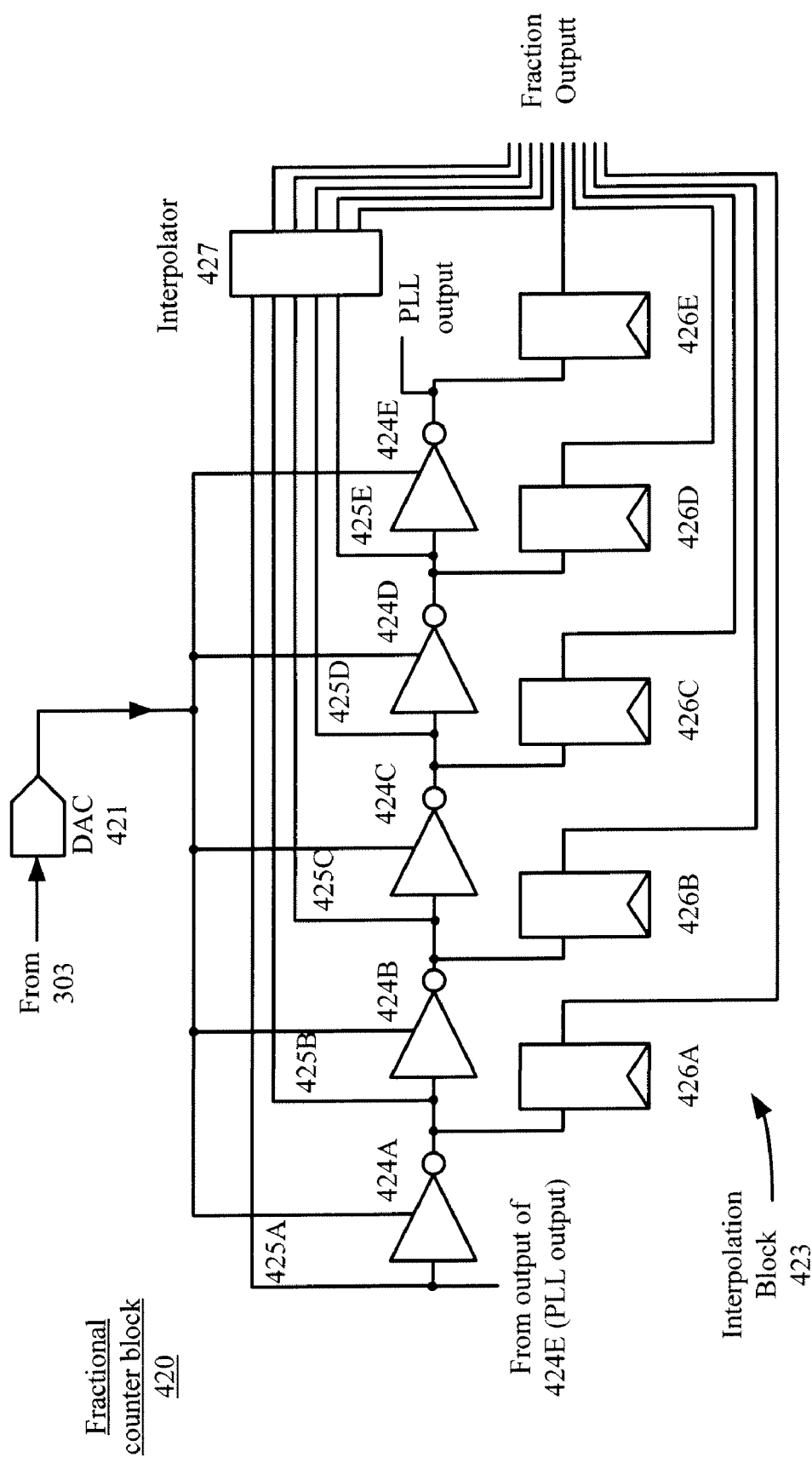
FIG. 4B illustrates an exemplary fractional counter block.

FIG. 4B illustrates an exemplary fractional counter block 420 including a digital to analog converter (DAC) 421 that receives the outputs of digital loop filter 303 (FIG. 3) and an interpolation block 423 that receives the outputs of DAC 421. Note that DAC 421 can be implemented with a current DAC, a voltage DAC, or a charge-based DAC that can control components in fractional counter block 420. In one embodiment, interpolation block 423 can include a delay line having a plurality of inverters (delay cells) (424A-424E) and a plurality of flip-flops 426A-426E, each flip-flop 426 for storing an output of its corresponding delay cell 424 (e.g. flip-flop 426C stores an output of delay cell 424C). Advantageously, the plurality of delay cells 424A-424E can function as a ring oscillator based DVCO whose oscillation frequency is controlled by programming current, voltage, or charge through a digital control code provided by DAC 421. In one embodiment, flip-flops 426A-426E are clocked by a reference clock (refclk). The outputs of flip-flops 426A-426E and the outputs of an interpolator 427 provide the M-bit fraction output.

Interpolator 427 receives the signals at the input and output of each of delay cells 424A-424E via lines 425A-425E (noting that the output of delay cell 424E is connected to the input of delay cell 421A, labeled PLL output) and latches an interpolated value for each pair of signals. Therefore, in this embodiment, interpolator 427 receives five signals and latches five interpolated signals, which form part of the M-bit fraction output.

Figure 4C:
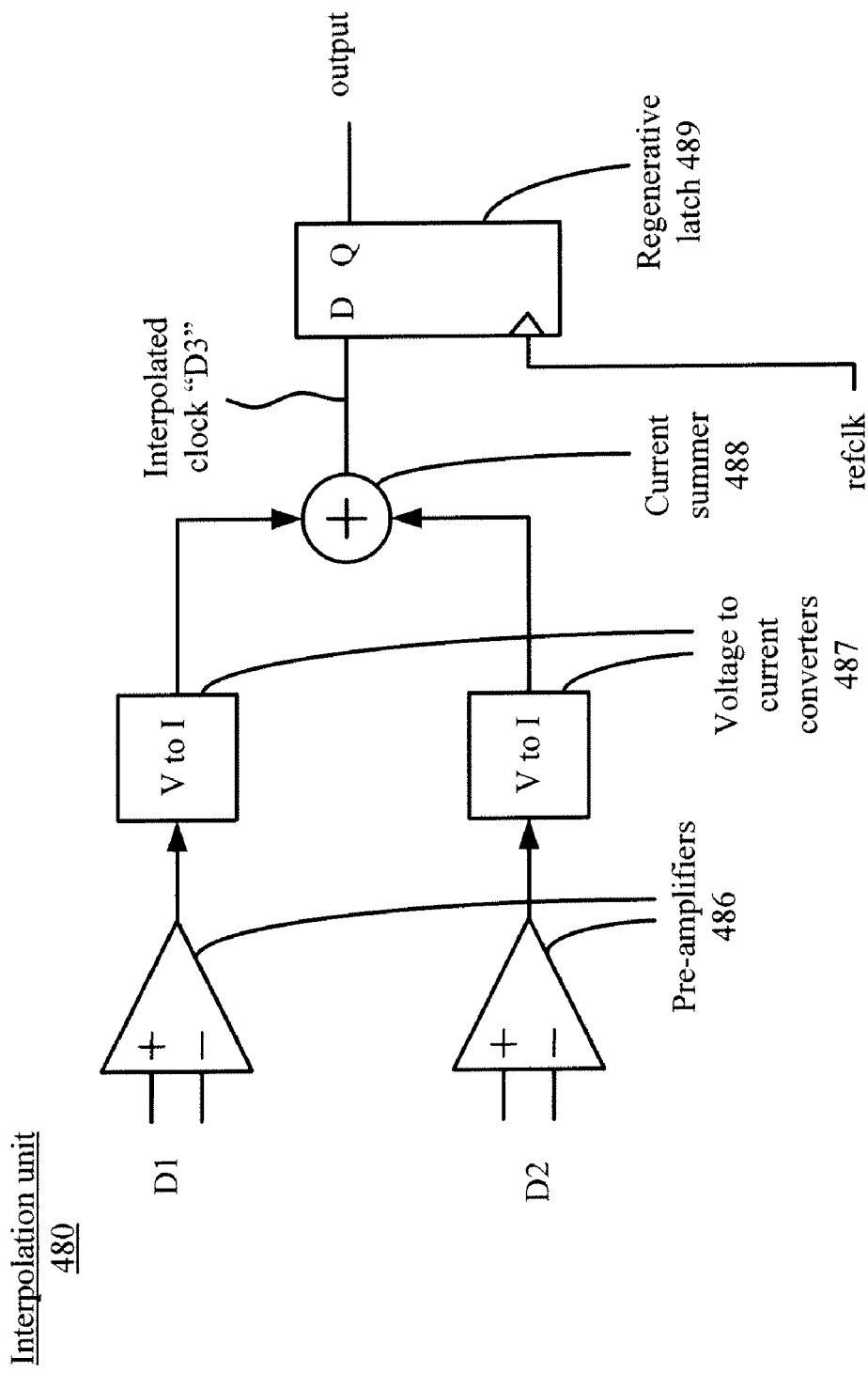
FIG. 4C illustrates an exemplary interpolation unit for the interpolator shown in FIG. 3B.

FIG. 4C illustrates an exemplary interpolation unit 480 that can form part of interpolator 423. In one embodiment, interpolator cell 480 can include two pre-amplifiers 486 that receive two clock waveforms D1 and D2 (wherein D1 could represent the signal on line 425B and D2 could represent the signal on line 425C, for example) with different phases. The amplified differential output of pre-amplifiers 486 can be converted into differential currents using voltage to current converters 487. A current summer 488 can sum the differential currents. A regenerative latch 489 can capture that sum based on the reference clock refclk. In this configuration, regenerative latch 489 effectively latches a virtually interpolated clock waveform D3. Ideally, if pre-amplifiers 486 receiving D1 and D2 are identical, then regenerative latch 489 can latch a clock whose phase is interpolated exactly at the mid point of D1 and D2. Note that by skewing pre-amplifiers 486, the interpolated phase can be moved closer to D1 or D2.

Referring back to FIG. 4A, the function of timing de-skew block 430 is to correctly align the K-bit integer output of integer counter block 410 with the M-bit fraction output of fractional counter block 420. Flip-flops 405 and 406 receive the output of buffer 403 (i.e. the buffered PLL output) as clock signals, the power supply as input signals (i.e. logic ones at both input terminals), and the reference clock signal refclk as reset signals. In this configuration, when the reference clock refclk goes high, flip-flop 405 captures the first instance of a rising edge of the VCO clock (i.e. a high output signal edgeR) whereas flip-flop 406 captures the first instance of a falling edge of the VCO clock (i.e. a high output signal edgeF).

Multiplexer 409 can be controlled by a signal generated by flip-flops 407 and 408. Specifically, flip-flop 407 receives the output of buffer 403, provides its output to flip-flop 408, which in turn provides its output to the control terminal of multiplexer 409. In this embodiment, flip-flops 407 and 408 are both clocked by the reference clock refclk, but flip-flop 408 receives a slightly delayed version (e.g. 0.5 ns) of refclk because of a buffer 410 included to alleviate the metastability issue.

Each of flip-flops 412 and 413 receives the outputs (in one embodiment, 9 bits) of counter 402 and captures those signals based on signals edgeR and edgeF, i.e. the clock signals for flip-flops 412 and 413, respectively. Multiplexer 409 selects the output bits from either flip-flop 412 or flip-flop 413 based on the output of flip-flop 408. In this configuration, timing de-skew block 430 can advantageously eliminate the timing skew in between the integer output and the fraction output (which can cause large phase error when uncorrected).

Figure 4D:
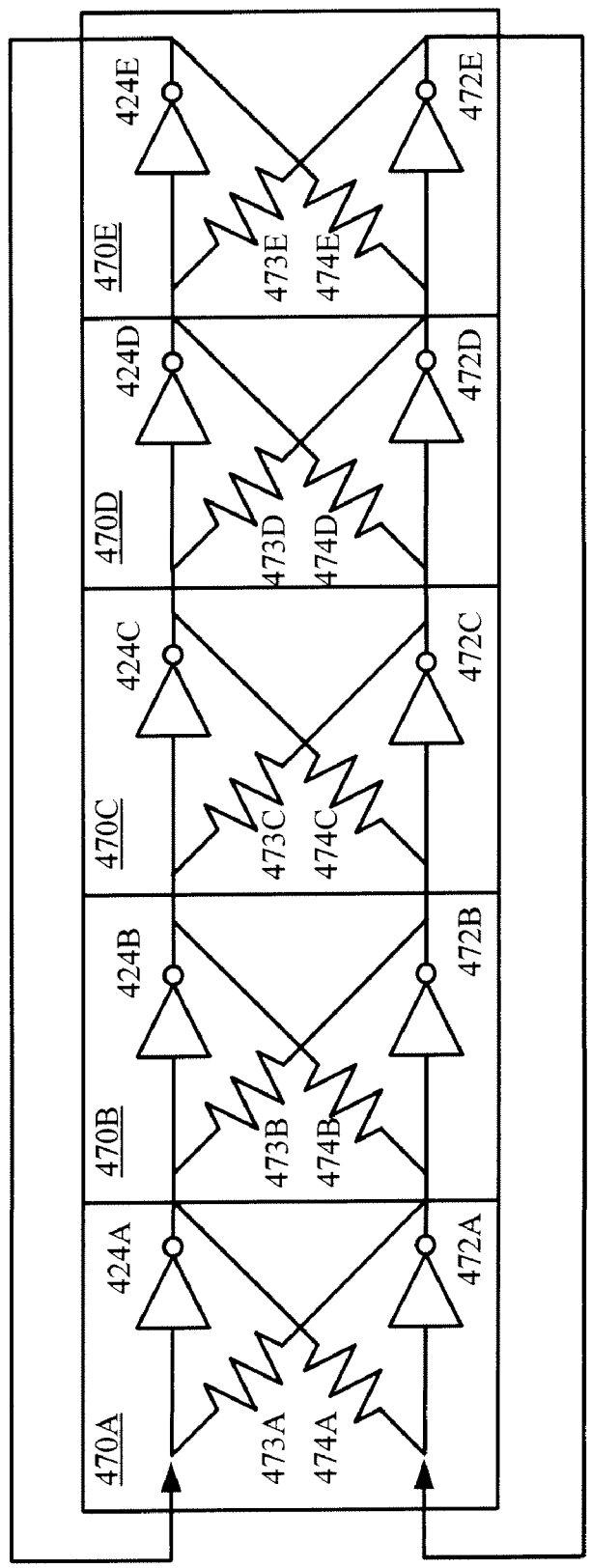
FIG. 4D illustrates exemplary delay cells of the DVCO for the improved fractional PLL shown in FIG. 2.

FIG. 4D illustrates a set of exemplary VCO cells 470A-470E in a differential configuration, which could form part of DDVCO 304. VCO cell 470A includes two CMOS inverters 424A and 472A in a cross-coupled configuration. Specifically, the output of inverter 424A is coupled to the input of its corresponding inverter 472A in cell 470A via a resistor 474A.

Similarly, the output of inverter 472A is coupled to the input its corresponding inverter 424A in cell 470A via a resistor 473A. VCO cells 470B-470E have the same configuration and therefore are not described in further detail. Note that to form a ring oscillator, the outputs of the last VCO cell 470E are also connected as inputs to the first VCO cell 470A. For example, an output of inverter 424E is connected to the input of inverter 424A. Similarly, an output of inverter 472E is connected to the input of inverter 472A. Resistors 473A-473E and 474A-474E can provide weak cross-coupling (e.g. 40 kOhms), thereby advantageously providing spatial filtering and minimizing mismatch in fractional counter block 420 (recalling that in the embodiment shown in FIG. 4A, fractional counter block 420 is merged with the DVCO of the PLL). Additionally, the weak coupling provided by resistors 473A and 474A-474E is advantageously independent of the speed of the ring oscillator (e.g. formed by VCO cells 470A-470E) as controlled by DAC 421.

Note that in this differential configuration, inverters 472A-472E can be connected to flip-flops 426A-426E and interpolator 427 in a similar manner as inverters 424A-424E. In this configuration, flip-flops 426A-426E can have differential inputs and outputs. As a result, interpolator 427 and flip-flops 426A-426E provide 2× the outputs shown in FIG. 4B to form the fraction output.

Figure 5A:
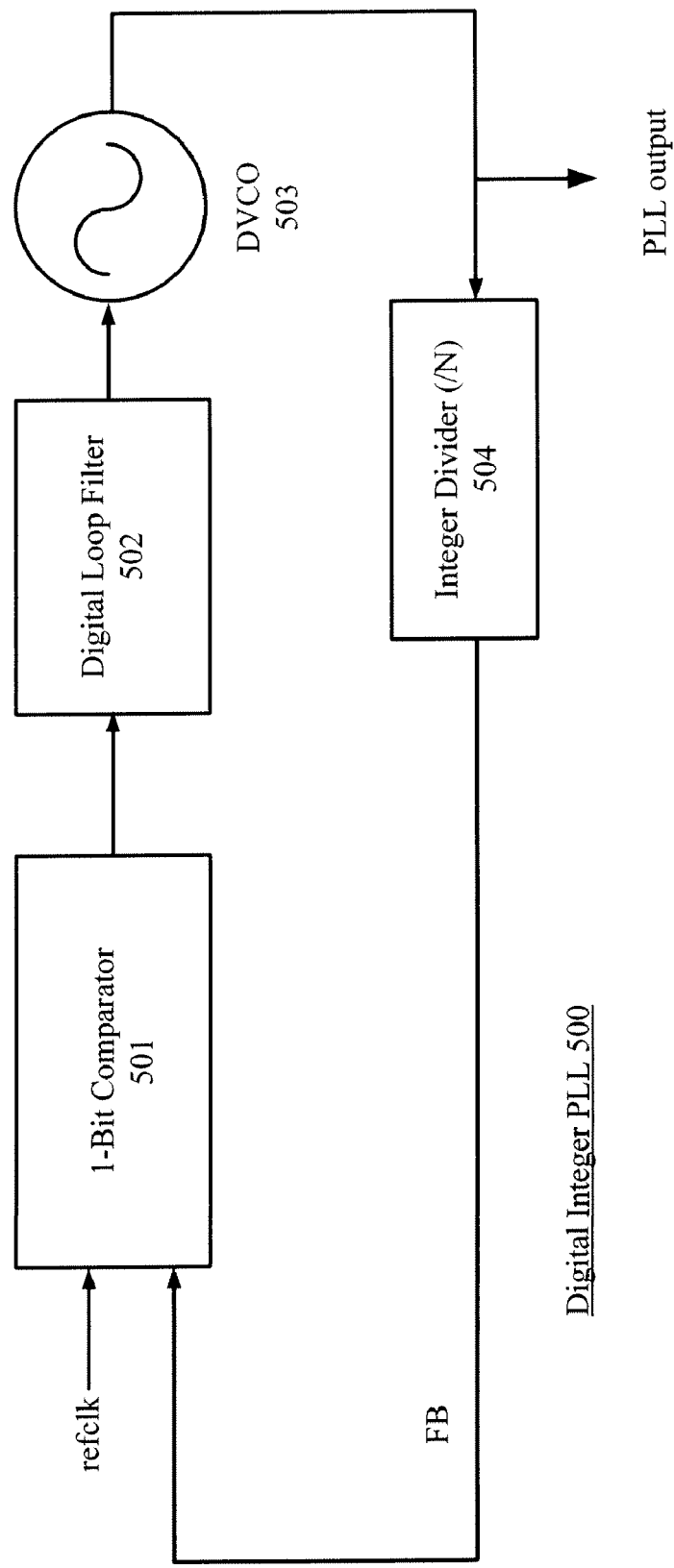
FIG. 5A illustrates an improved digital integer PLL.

FIG. 5A illustrates an exemplary digital integer PLL 500 that includes a 1-bit comparator 501, a digital loop filter 502, a DVCO 503, and an integer divider 505. In this embodiment, comparator 501 determines phase differences between a feedback signal FB_ (e.g. 1 bit) generated by integer divider 504 and a reference clock signal refclk. Digital loop filter 502 filters the outputs of comparator 501 to generate a digital control word, which is provided to DVCO 503. Integer divider 504 receives the PLL output and generates the feedback signal FB.

Figure 5B:
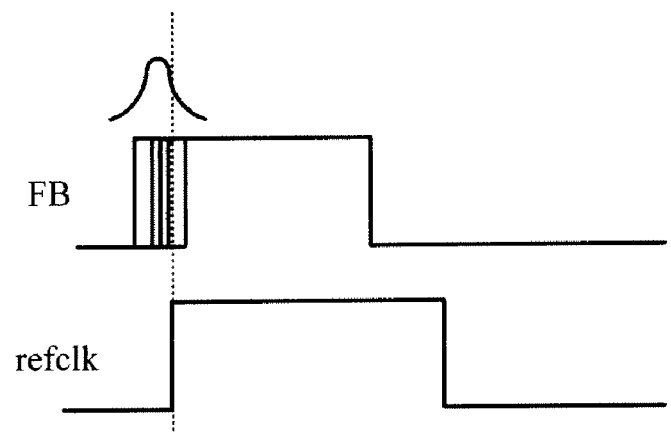
FIG. 5B illustrates exemplary waveforms associated with the digital integer PLL shown in FIG. 5A.
Figure 5C:
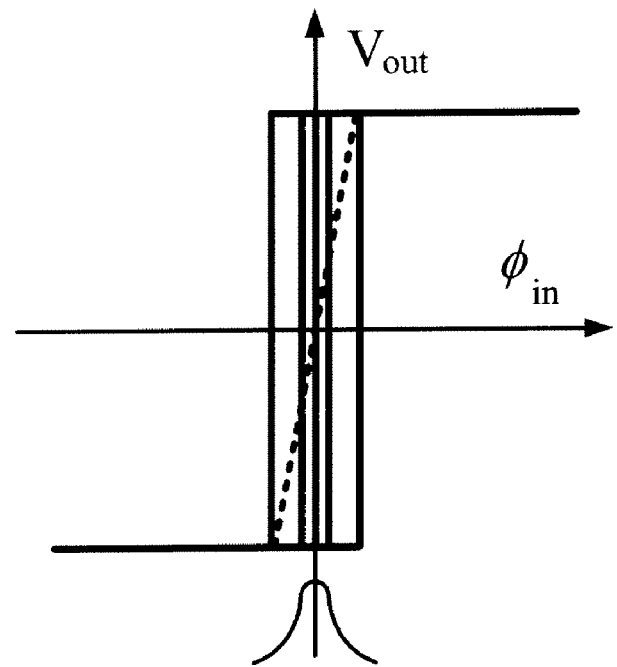
FIG. 5C illustrates an exemplary output voltage as a function of a phase difference.

Advantageously, a 1-bit comparator is sufficient for digital integer PLL 500 because digital loop filter 502 can force the phase difference between reference clock signal refclk and feedback signal FB to approach zero. FIG. 5B illustrates an exemplary reference clock signal refclk and a feedback signal FB including some noise/jitter. FIG. 5C illustrates an exemplary output voltage as a function of a phase difference.

Note that although comparator 501 is actually a non-linear operator, comparator 501 can be approximated as a linear PFD. For example, in one embodiment, comparator 501 can be implemented by simple latch that receives the refclk on its input terminal and the feedback signal on it clock terminal. In this configuration, because of the jitter on the feedback signal FB, comparator 501 functions like a linear detector in the vicinity of zero crossing. Furthermore, by changing the duty cycle of FB signal, the frequency tracking behavior of the loop can be varied. Alternatively, the frequency detection can be done in the 1-bit comparator. Note that an additional frequency detection loop can be used to further reduce the loop settling time, which is well known to those skilled in the art.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent.

Figure 6:
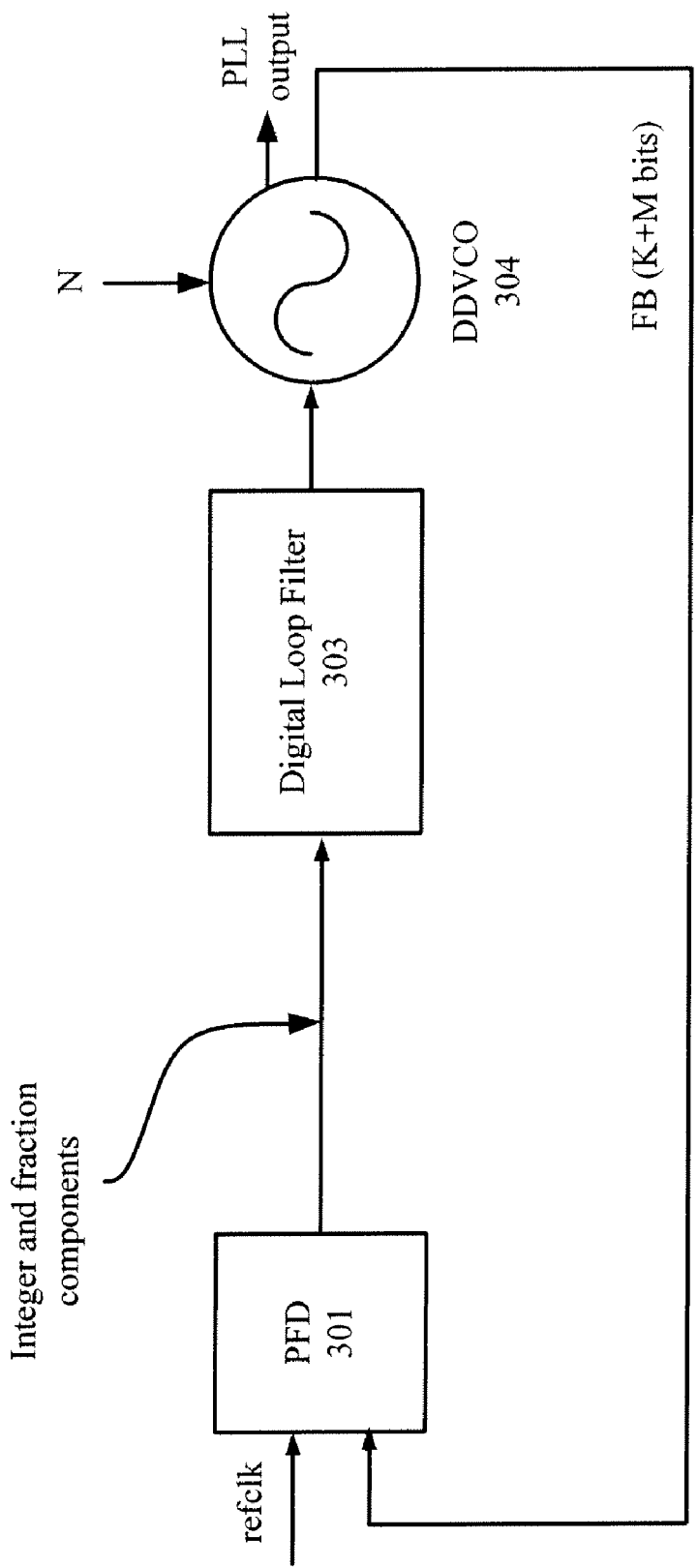
FIG. 6 illustrates an integer N PLL implemented by disabling/removing the digital accumulator of the digital fractional PLL shown in FIG. 3.

For example, although digital fractional PLL 201 (FIG. 2) and digital integer PLL 500 (FIG. 5) are described as separate embodiments, it is possible to implement digital integer PLL 500 using the components described with respect to digital fractional PLL 201, but disabling certain components (e.g. the components associated with the fractional component as well as other components). For example, FIG. 6 illustrates an integer N PLL 600 implemented by disabling (or removing) digital accumulator block 308 of digital fractional PLL 300 (FIG. 3).

Figure 7:
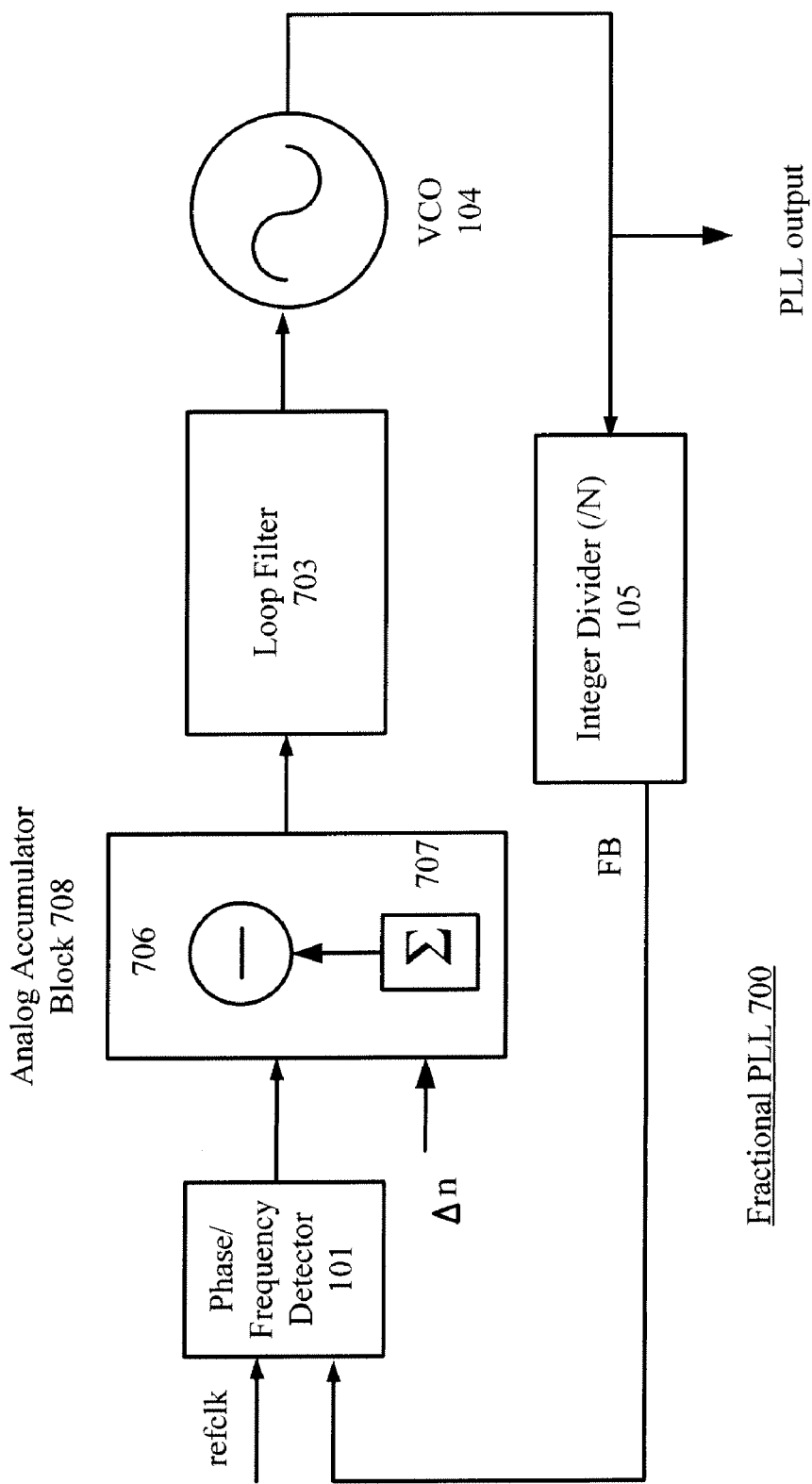
FIG. 7 illustrates an improved fractional-N PLL with an analog accumulator.

Note that including an accumulator in the forward path, i.e. between a PFD and a loop filter, can be implemented in either digital or analog configurations. For example, FIG. 7 illustrates an improved fractional-N PLL 700 with an analog accumulator block 708 provided between PFD 101 and loop filter 103 (wherein components having the same reference numbers have similar functionality). PLL 700 introduces an accumulated phase offset to the output of PFD 101 using a subtractor 706 and an analog accumulator 707 (wherein subtractor 706 and analog accumulator 707 can be characterized as analog accumulator block 708). Specifically, analog accumulator 707 can be used to integrate the signals Δn, which represents a fractional part of the division ratio, and provide that integrated value as an input to subtractor 706. Subtractor 706 subtracts that integrated value from the output of PFD 101. Loop filter 703 filters the outputs of analog accumulator block 708 to generate an analog control word, which is provided to VCO 104. This analog control word will adjust either a current, voltage, or charge of VCO 101 to adjust its oscillation frequency.

Accordingly, it is intended that the scope of the invention be defined by the following Claims and their equivalents.

The invention claimed is:

1. A digital fractional phase-locked loop (PLL) comprising:
   a digital-in digital-out voltage controlled oscillator (DDVCO) for generating a PLL output and a feedback signal, the feedback signal including an integer output and a fraction output;
   a phase/frequency detector for determining phase differences between the feedback signal and a reference clock signal, and generating digital representations based on the integer output and the fraction output;
   a digital accumulator block for introducing an accumulated phase offset to the digital representations using a fractional component of a division ratio; and
   a digital loop filter for integrating outputs of the digital accumulator block and providing a resulting voltage to the DDVCO,
   wherein the DDVCO includes:
   an integer counter block for generating the integer output;
   a fractional counter block for generating the fraction output; and
   a timing de-skew block for ensuring alignment between the integer output and the fraction output,
   wherein the integer counter block and the timing de-skew block receive a PLL output generated by the fractional counter block, and the fractional counter block receives an output of the digital loop filter.

2. The digital fractional PLL of claim 1, wherein the timing de-skew block includes a first set of flip-flops for generating a rising edge signal and a falling edge signal, wherein the rising edge signal indicates a first instance of the PLL output rising after a reference clock goes high, wherein the falling edge signal indicates a first instance of the PLL output falling after the reference clock goes low, wherein the integer counter block receives the rising edge signal and the falling edge signal.

3. The digital fractional PLL of claim 2, wherein the timing de-skew block further includes a second set of flip-flops connected in series and being clocked by the reference clock, the second set of flip-flops for receiving the PLL output and generating a control signal for the integer component.

4. The digital fractional PLL of claim 3, wherein the integer counter block includes:
   a counter for receiving the PLL output;
   a first flip-flop for receiving bits stored by the counter and clocked by the rising edge signal;
   a second flip-flop for receiving the bits stored by the counter and clocked by the falling edge signal; and
   a multiplexer for selecting between outputs of the first and second flip-flops based on the control signal, the multiplexer generating the integer output.

5. The digital fractional PLL of claim 1, wherein the fractional counter block includes:
   a first set of delay cells connected in a daisy chain configuration;
   a first set of flip-flops for storing respective outputs of the first set of delay cells; and
   a first set of interpolator cells for providing interpolated values based on the first set of delay cells,
   wherein outputs of the first set of flip-flops and the first set of interpolator cells provide the fraction output.

6. The digital fractional PLL of claim 5, wherein the fractional counter block further includes a digital to analog converter (DAC) that controls each of the first set of delay cells.

7. The digital fractional PLL of claim 6, wherein the DAC is implemented with one of a current DAC, a voltage DAC, and a charge-based DAC.

8. The digital fractional PLL of claim 5, wherein each interpolator cell includes:
   first and second pre-amplifiers that amplify two differential clock waveforms;
   first and second voltage to current converters that receive amplified outputs of the first and second pre-amplifiers, respectively;
   a summer that sums outputs of the first and second voltage to current converters; and
   a regenerative latch that stores an output of the summer, which is an interpolated value.

9. The digital fractional PLL of claim 5, wherein one of the first set of delay cells generates the PLL output.

10. The digital fractional PLL of claim 6, wherein the fractional counter block further includes:
    a second set of delay cells connected in a daisy chain configuration, wherein the first set of flip-flops are differential flip-flops that also store respective outputs of the second set of delay cells; and
    a second set of interpolator cells for providing interpolated values based on the second set of delay cells,
    wherein outputs of the second set of interpolator cells are included in the fraction output,
    wherein a VCO cell formed in the fractional counter block includes a first inverter of a delay cell of the first set of delay cells and a second inverter of a corresponding delay cell of the second set of delay cells, wherein an output of the first inverter is weakly connected to an input of the second inverter, and wherein an output of the second inverter is weakly connected to an input of the first inverter.

11. The digital fractional PLL of claim 10, wherein the DAC further controls each of the second set of delay cells.

12. A digital-in digital-out voltage controlled oscillator (DDVCO) comprising:
    an integer counter block for generating an integer output;
    a fractional counter block for generating a fraction output, the fractional counter block including:
      a digital to analog converter (DAC) for receiving a digital input; and
      one or more sets of delay cells, each set in a daisy chain configuration, for generating an oscillation frequency and the fraction output, wherein the DAC controls the oscillation frequency of the delay cells; and
    a timing de-skew block for ensuring alignment between the integer output and the fraction output.

13. The DDVCO of claim 12, further including an interpolator that receives outputs of the one or more sets of delay cells to generate finer resolution fractional outputs of the DDVCO.

14. The DDVCO of claim 12, wherein the one or more sets of delay cells includes first and second sets of delay cells, and
    wherein a VCO cell formed in the fractional counter block includes a first inverter of a delay cell of the first set of delay cells and a second inverter of a corresponding delay cell of the second set of delay cells, wherein an output of the first inverter is connected to an input of the second inverter via a resistor, and wherein an output of the second inverter is connected to an input of the first inverter via another resistor.

\* \* \* \* \*